US009518414B1

(12) United States Patent
Chen et al.

(10) Patent No.: US 9,518,414 B1
(45) Date of Patent: Dec. 13, 2016

(54) HINGE DEVICE CAPABLE OF EXTENDING ROTATIONAL ANGLE

(71) Applicant: LIANHONG ART CO., LTD., Taoyuan (TW)

(72) Inventors: Chia-Hui Chen, Taoyuan (TW); Yen-Ting Chen, Taoyuan (TW)

(73) Assignee: LIANHONG ART CO., LTD., Taoyuan (TW)

( * ) Notice: Subject to any disclaimer, the term of this patent is extended or adjusted under 35 U.S.C. 154(b) by 0 days.

(21) Appl. No.: 15/193,032

(22) Filed: Jun. 25, 2016

Related U.S. Application Data (63) Continuation-in-part of application No. 14/944,344, filed on Nov. 18, 2015, now Pat. No. 9,404,298.

(30) Foreign Application Priority Data

Nov. 3, 2015 (TW) .............................. 104217549 U
Dec. 23, 2015 (TW) .............................. 104220576 U (51) Int. Cl.
| | |
|---|---|
| E05D 1/04 | (2006.01) |
| E05D 11/08 | (2006.01) |
| E05D 11/06 | (2006.01) |
| H05K 5/00 | (2006.01) |
| H05K 5/02 | (2006.01) |

(52) U.S. Cl.
CPC ............. *E05D 11/082* (2013.01); *E05D 11/06* (2013.01); *H05K 5/0086* (2013.01); *H05K 5/0226* (2013.01); *E05Y 2900/606* (2013.01)

(58) Field of Classification Search
CPC .... Y10T 16/542; Y10T 16/543; Y10T 16/544; Y10T 16/5443; Y10T 16/5445; Y10T 16/5448; Y10T 16/545; Y10T 16/54038; G06F 1/16; G06F 1/1616; G06F 1/1681; G06F 1/166; G06F 1/1679; H04M 1/022; H04M 1/0214; H04M 1/0216; H04M 1/0222; H05K 5/0226; F16M 11/10; E05D 11/1021; E05D 11/1078; E05D 11/082; E05D 3/18; E05D 3/122; E05D 3/12; E05D 3/16; E05D 3/06; E05D 3/32; E05D 15/28; E05D 15/30; E05D 15/32; E05D 15/40; E05D 1/04; E05D 2001/045; E05Y 2900/606

See application file for complete search history.

(56) References Cited

U.S. PATENT DOCUMENTS

| | | | | |
|---|---|---|---|---|
| 1,618,781 A | * | 2/1927 | Reuleke ................... | A42B 1/18 2/175.6 |
| 4,342,135 A | * | 8/1982 | Matsuo ..................... | F16F 9/12 16/225 |
| 4,642,449 A | * | 2/1987 | Baitz ..................... | G07G 1/0027 235/1 B |

(Continued)

*Primary Examiner* — Chuck Mah
(74) *Attorney, Agent, or Firm* — Guice Patents PLLC (57) ABSTRACT

A hinge device includes a housing comprising two half-housings, a first extending module comprising two half-members disposed in the housing, a second extending module comprising two half sliding members and disposed on an outer side of the first extending module, a sliding device disposed between the first extending module and the second extending module, an elastic member disposed between the two half housings, and a stop sheet disposed between the half-housings and having one end facing a bottom of the second extending module.

9 Claims, 8 Drawing Sheets

(56) References Cited

U.S. PATENT DOCUMENTS

| | | | | |
|---|---|---|---|---|
| 5,061,023 | A * | 10/1991 | Soubliere | E05D 1/04 16/355 |
| 5,168,426 | A * | 12/1992 | Hoving | G06F 1/1681 16/361 |
| 5,566,424 | A * | 10/1996 | Crompton | G06F 1/1601 16/337 |
| 6,292,981 | B1 * | 9/2001 | Ford | E05D 1/04 16/357 |
| 6,317,929 | B1 * | 11/2001 | Ring | E05D 1/04 16/355 |
| 6,351,535 | B1 * | 2/2002 | Nogas | H04M 1/12 379/435 |
| 7,337,499 | B2 * | 3/2008 | Zhang | G03G 21/1666 16/286 |
| 8,272,104 | B2 * | 9/2012 | Chen | G06F 1/1616 16/327 |
| 8,453,299 | B2 * | 6/2013 | Li | G06F 1/1624 16/257 |
| 8,713,757 | B2 * | 5/2014 | Chen | G06F 1/1616 16/327 |
| 8,763,206 | B1 * | 7/2014 | Gong | E05D 1/04 16/355 |
| 8,769,773 | B2 * | 7/2014 | Katsuta | G06F 1/1624 16/286 |
| 2005/0225934 | A1 * | 10/2005 | Homer | G06F 1/1616 361/679.21 |
| 2007/0180657 | A1 * | 8/2007 | Zeilbeck | B60R 7/06 16/354 |
| 2010/0299879 | A1 * | 12/2010 | Yang | E05D 3/04 16/387 |
| 2011/0023272 | A1 * | 2/2011 | Huang | E05D 3/18 16/362 |
| 2011/0216483 | A1 * | 9/2011 | Vesely | B60N 3/004 361/679.01 |
| 2012/0175478 | A1 * | 7/2012 | Chen | G06F 1/1624 248/286.1 |
| 2012/0227217 | A1 * | 9/2012 | Chen | G06F 1/1681 16/366 |
| 2016/0083989 | A1 * | 3/2016 | Kuo | E05D 5/10 16/355 |
| 2016/0097227 | A1 * | 4/2016 | Hsu | E05D 3/122 16/354 |

* cited by examiner

HINGE DEVICE CAPABLE OF EXTENDING ROTATIONAL ANGLE

BACKGROUND OF THE INVENTION

Field of the Invention

The invention relates to a hinge device capable of extending rotational angle, and more particularly to a hinge device for stands of electronic devices opening to a marge angle stably and reliably.

Description of the Related Art

Since mobile devices such as tablets are often held by both hands, a user who uses the mobile devices is easily tired. The mobile devices put on thigh are easily to slide, which may bother the user. To solve the problem, a stand is attached to the mobile devices and the mobile device can be set upright by the stand for stable and convenient operation.

The stand is pivoted to the mobile devices at one end, and the other end is free. When the stand is not to be used, it can be folded and accommodated on the back of the mobile devices. When the stand is used, it can be rotated about the pivoted end and opened to various angles. Since the stand must also positioned at desired angle, the pivoted end often includes a hinge device having rotational mechanism and positioning mechanism. However, conventional hinge devices can only be rotated to a small angle and have a mechanism of high freedom, which causes the mobile device unstable when it is used.

BRIEF SUMMARY OF THE INVENTION

An object of the invention is to provide a hinge device having a large rotational angle and a stable mechanism.

The hinge device in accordance with an exemplary embodiment of the invention includes a housing comprising two half-housings, each of the half-housings having two extending plates extending from two ends thereof for mounting to an electronic device, the half-housings are assembled to form an inner space, and each of the half-housings having a stroke groove and a curved groove in a corresponding position; a first extending module comprising two half-members disposed in the inner space, each of the half-members has a curved portion at one end thereof; a torque-stroke controlling mechanism having one end disposed between the half-members and the other end at which a first shaft is disposed, and the shaft extends through the stroke grooves of the two half-housings; a second extending module comprising two half sliding members and disposed on an outer side of the first extending module, each of the half sliding member having a push portion disposed on one end thereof and facing a bottom of the first extending module, a stop portion disposed behind the push portion and a guiding tab having a curved shape and a predetermined length and engaging the curved groove; a sliding device disposed between the first extending module and the second extending module; an elastic member having one end disposed between the half-housings and the other end biasing the second extending module; and a stop sheet disposed between the half-housings and having one end facing a bottom of the second extending module.

In another exemplary embodiment, the torque-stroke controlling mechanism comprises a torque module connected to a connecting member in which the first shaft is disposed.

In yet another exemplary embodiment, the torque module has a sleeve through which a second shaft extends, and the first extending module comprises two grooves with which two ends of the second shaft engages.

In another exemplary embodiment, the sliding device comprises two first rails disposed on an outer side of the half-members, and each of the half sliding members has a curved groove in which the first rail slides.

In yet another exemplary embodiment, the elastic member is a coiled spring, and the one end has two sides and the other end is U-shaped, each of the half housings has a chamber accommodating the elastic member, and the chamber has two slots into which the two sides of the one end are inserted, and a bolt extends through the elastic member.

In another exemplary embodiment, the second extending module has a pressing portion configured to be pressed by the other end of the elastic member.

In yet another exemplary embodiment, the second extending module has a pressing portion configured to be pressed by the other end of the elastic member.

In another exemplary embodiment, the stop sheet has a convex portion, and the second extending portion has a stopping end on which a recess configured to engage the convex portion is formed.

In yet another exemplary embodiment, the stop sheet is positioned on a depressed portion of the two half-housings, and the convex portion faces the stop portion and the recess.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Referring to FIGS. 1 to 4, a hinge device of the invention includes a housing 120. The housing 120 includes two half housings 10 and 20. The half housing 10 has an extending plate 11, and the half housing 20 has an extending plate 21. The extending plate 11 and the extending plate 21 are connected to an electronic device (not shown). The half housings 10 and 20 are combined by bolts 100 to form an inner space 121 accommodating a first extending module 340. The first extending module 340 includes two half members 30 and 40. The half member 30 has a curved portion 33 at one end of the half member 30, and the half member 40 has a curved member 43 at one end of the half member 40. The half members 30 and 40 are connected to a stand (not shown) by a bolt 101. The half members 30 and 40 are combined by a bolt 103. A torque-stroke controlling mechanism 500 is disposed between the two half members 30 and 40. The torque-stroke controlling mechanism 500 includes a torque module 50. The torque module 50 is connected to a connecting member 51. A first shaft 52 is disposed in the connecting member 51. The first shaft 52 has two ends extending to two stroke grooves 12 and 22 formed on the half housings 10 and 20, and the first shaft 52 is positioned to the stroke grooves 12 and 22 by clamps 102 respectively. A second extending module 670 includes two half sliding members 60 and 70 disposed on an outer side of the half members 30 and 40 respectively. An elastic member 80 is disposed between the half housings 10 and 20 at one end, and a stop sheet 90 is disposed at the other end.

In this embodiment, the torque module 50 has a sleeve 53 through which a second shaft 54 extends. The second shaft 54 has two ends positioned in grooves 32 and 42, which provides torque for positioning when the torque module 50 rotates.

Figures 2, 2A:
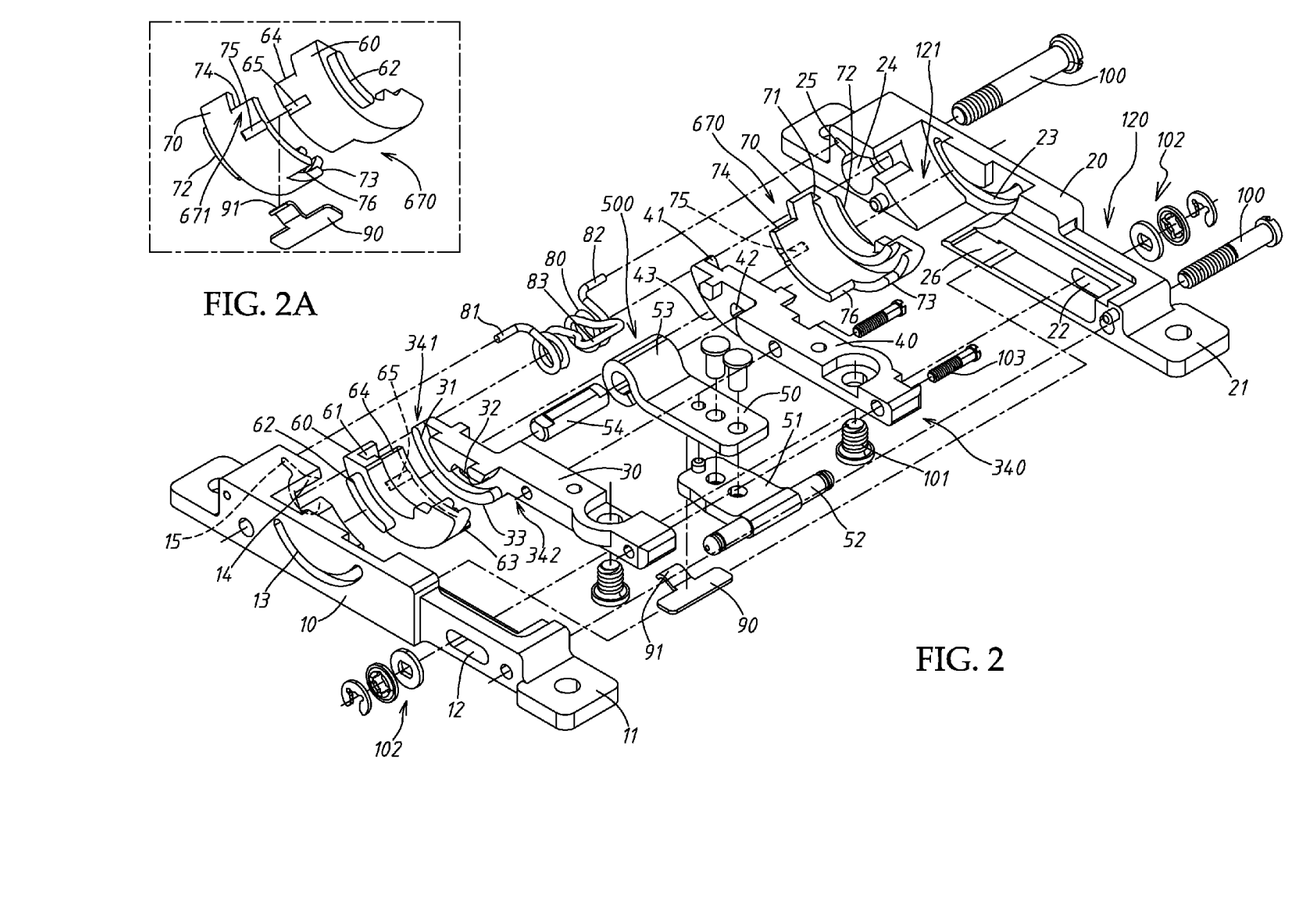
FIG. 2 is an exploded view of FIG. 1.
FIG. 2A is an enlarged view of a second extending module of FIG. 2.

A sliding device 341 is disposed between the first extending module 340 and the second extending module 670. In this embodiment, the sliding device 341 includes two first rails 31 and 41 disposed on the outer side of the half-members 30 and 40 respectively and two curved portions 33 and 43. The second extending module 670 further includes two curved grooves 61 and 71 in which the first rails 31 and 41 slides. Two push portions 63 and 73 axially extending outwards and a stop end 76 under the push portions 63 and 73 are disposed at one end of the second extending module 670 facing one end of the first extending module 340 (FIG. 2 shows only one stop end 76 of the half sliding member 70 but does not show another stop end of the half sliding member 60). The push portions 63 and 73 are disposed on a bottom 342 of the first extending module 340. The half sliding members 60 and 70 have curved guiding tabs 62 and 72 of predetermined length, and the half housings 20 and 30 have curved grooves 13 and 23 in which the guiding tabs 62 and 72 slide.

The elastic member 80 biases on one end of the half sliding members 60 and 70. In this embodiment, the elastic member 80 is a coiled spring and has two sides 81 and 82 and one U-shaped end 83 biasing the half sliding members 60 and 70. The half housings 10 and 20 have chambers 14 and 24 accommodating the elastic member 80. The chamber 14 has a slot 15, and the chamber 24 has a slot 25. The bolt 100 combines the half housings 10 and 20 so that the two sides 81 and 82 of the elastic member 80 are inserted into the slots 15 and 25. In this embodiment, the half sliding members 60 and 70 have pressing portions 64 and 74 for the U-shaped end 83 biasing thereon.

A stop device is disposed on a bottom of the two half sliding members 60 and 70. The stop device includes a stop sheet 90. The stop sheet 90 has a convex portion 91. In this embodiment, the stop sheet 90 is positioned on a recess 26 of the two half housings 10 and 20 (FIG. 2 shows only one recess 26). The convex portion 91 faces a stopping end 76 and a bottom surface 671. As shown in FIG. 2A, the bottom surface 671 has two depressed portions 65 and 75 configured to engage the convex portion 91 to stop the half sliding members 60 and 70.

Figure 3:
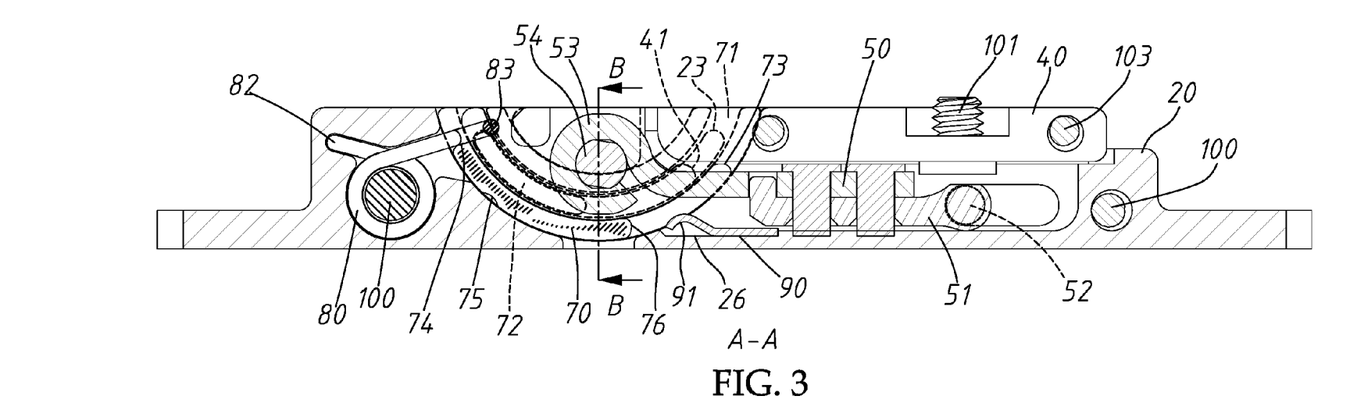
FIG. 3 is a cross section of FIG. 1 along a line A-A.
Figure 4:
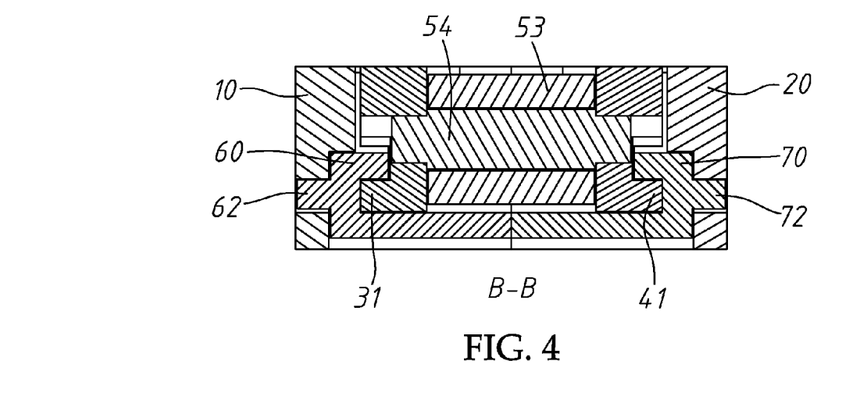
FIG. 4 is a cross section of FIG. 3 along a line B-B.
Figure 5:
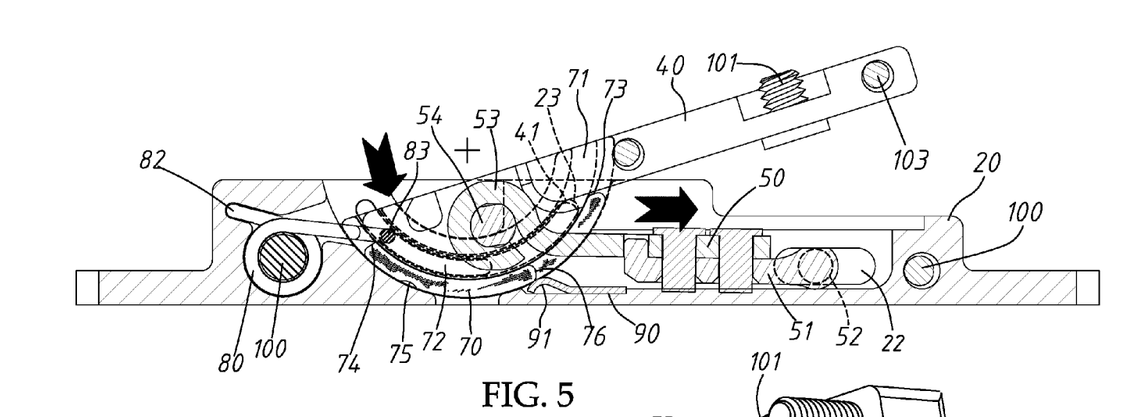
FIG. 5 is a cross section of the hinge device of FIG. 3 in an erected position.
Figure 6:
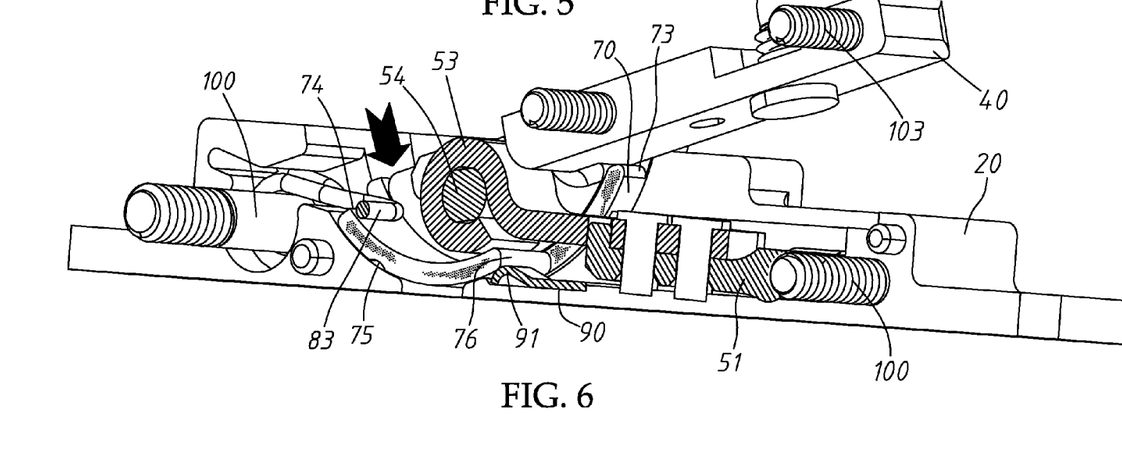
FIG. 6 is a partial cross section of FIG. 5.

Referring to FIGS. 2 and 3, the first extending module 340 connected to a stand is flushed with the hinge device when the stand is not released. When the stand is released, as shown in FIGS. 2, 5 and 6, the U-shaped end 83 of the elastic member 80 biasing the pressing portions 64 and 74 is pushed down to rotate the first extending module 340 and the second extending module 670 simultaneously so that the push portions 63 and 73 push the first extending module 340 to a predetermined angle for a user easily opening the stand. When the user continues to open the stand, the convex portion 91 props against the stopping end 76 to stop the rotation of the second extending module 670.

Figure 7:
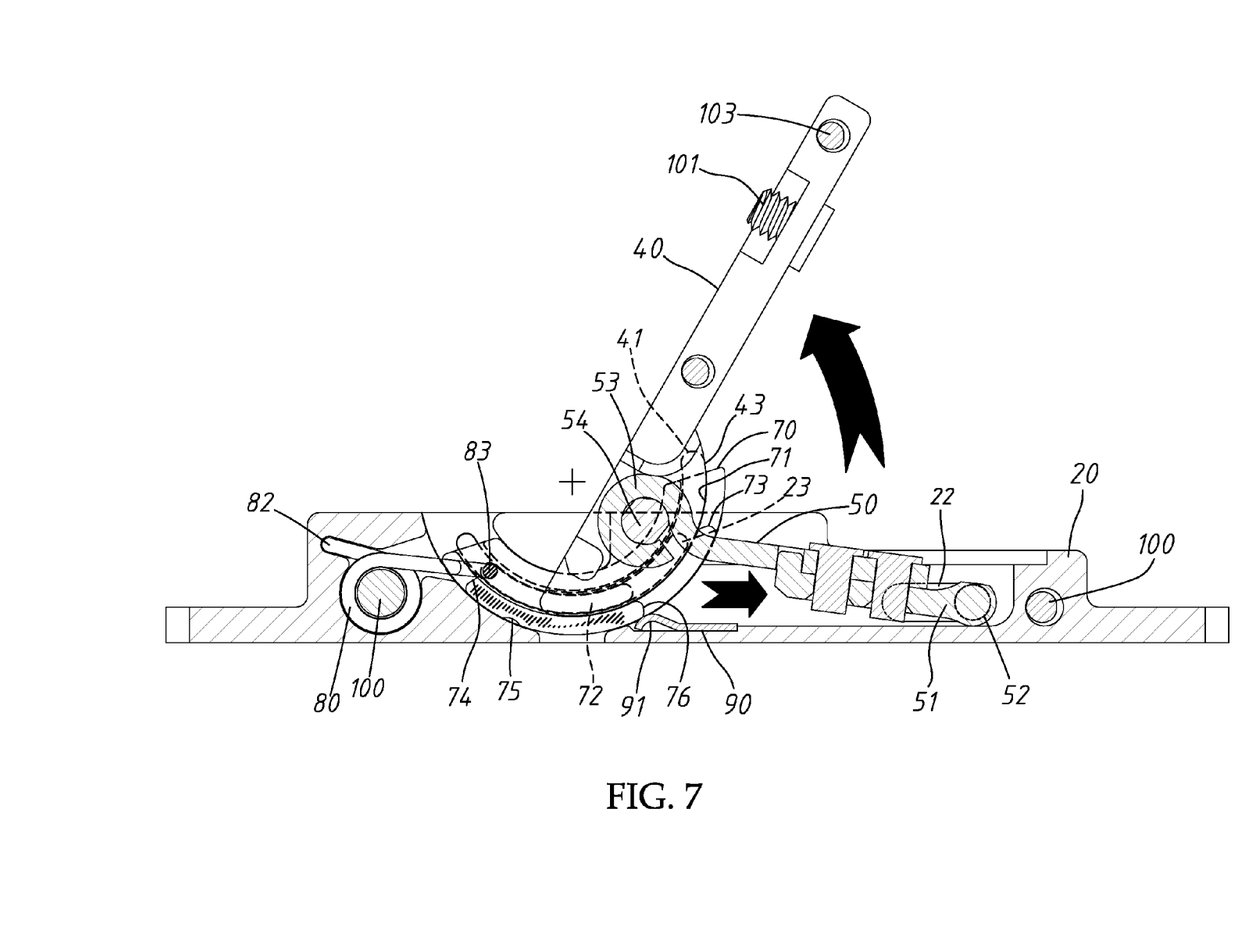
FIG. 7 is a cross section of the hinge device of FIG. 3 in an opened position.
Figure 8:
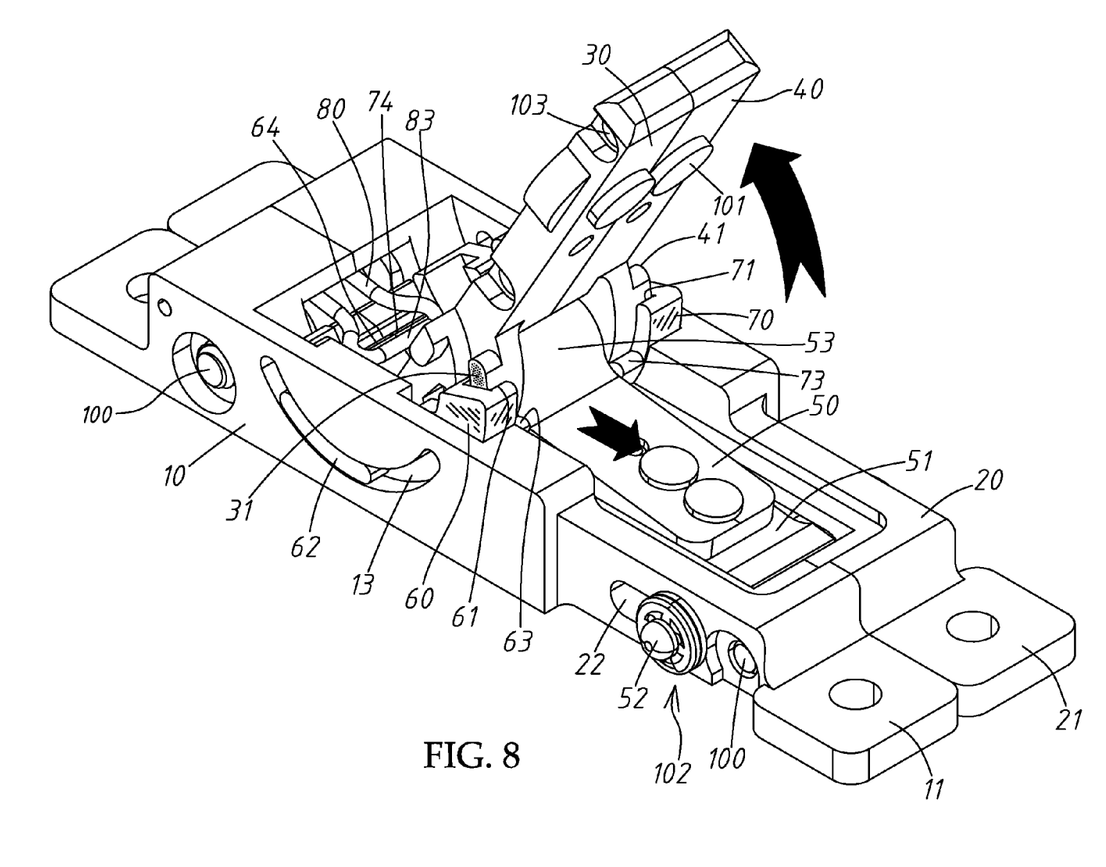
FIG. 8 is a perspective view of FIG. 7.

Referring to FIGS. 2, 7 and 8, as the second extending module 670 stops rotating, when the user continues to open the stand, the first extending module 340 is rotated to a greater angle through the first rails 31 and 41 sliding in the curved grooves 61 and 71 as shown in FIG. 7. During the rotation, the connecting member 51 and the first shaft 52 move back along a direction shown by the arrow until the first shaft 52 reaches a right end of the stroke grooves 12 and 22.

Figure 1:
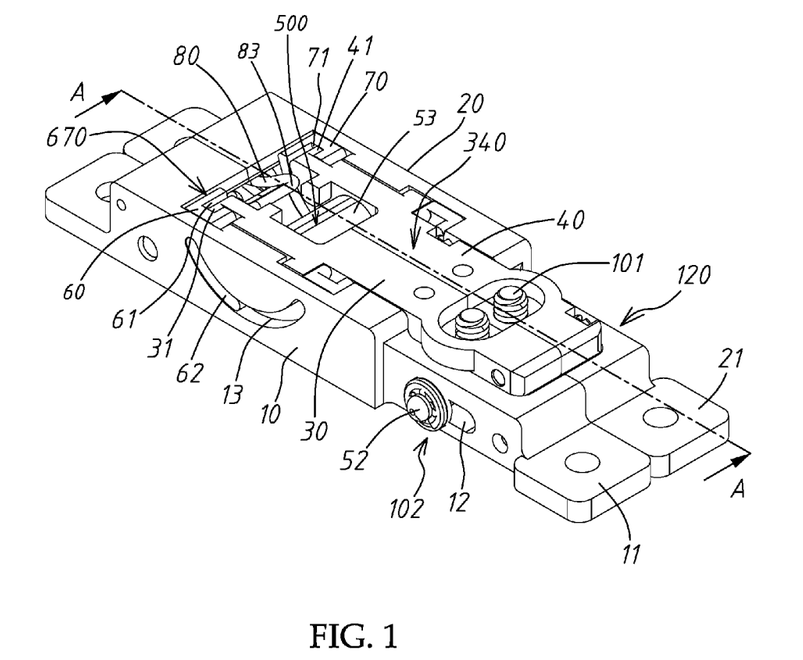
FIG. 1 is a perspective view of an embodiment of a hinge device of the invention.
Figure 9:
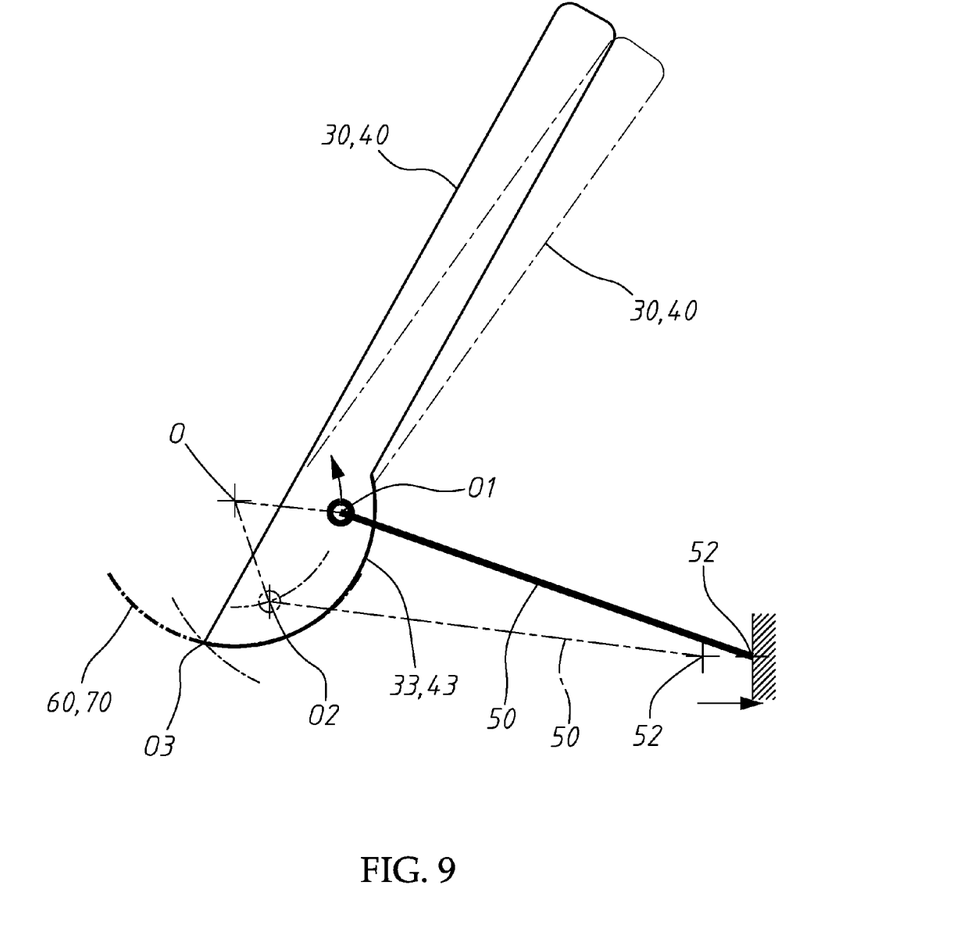
FIG. 9 is a cross section of the hinge device of FIG. 7 in a next opened position.
Figure 10:
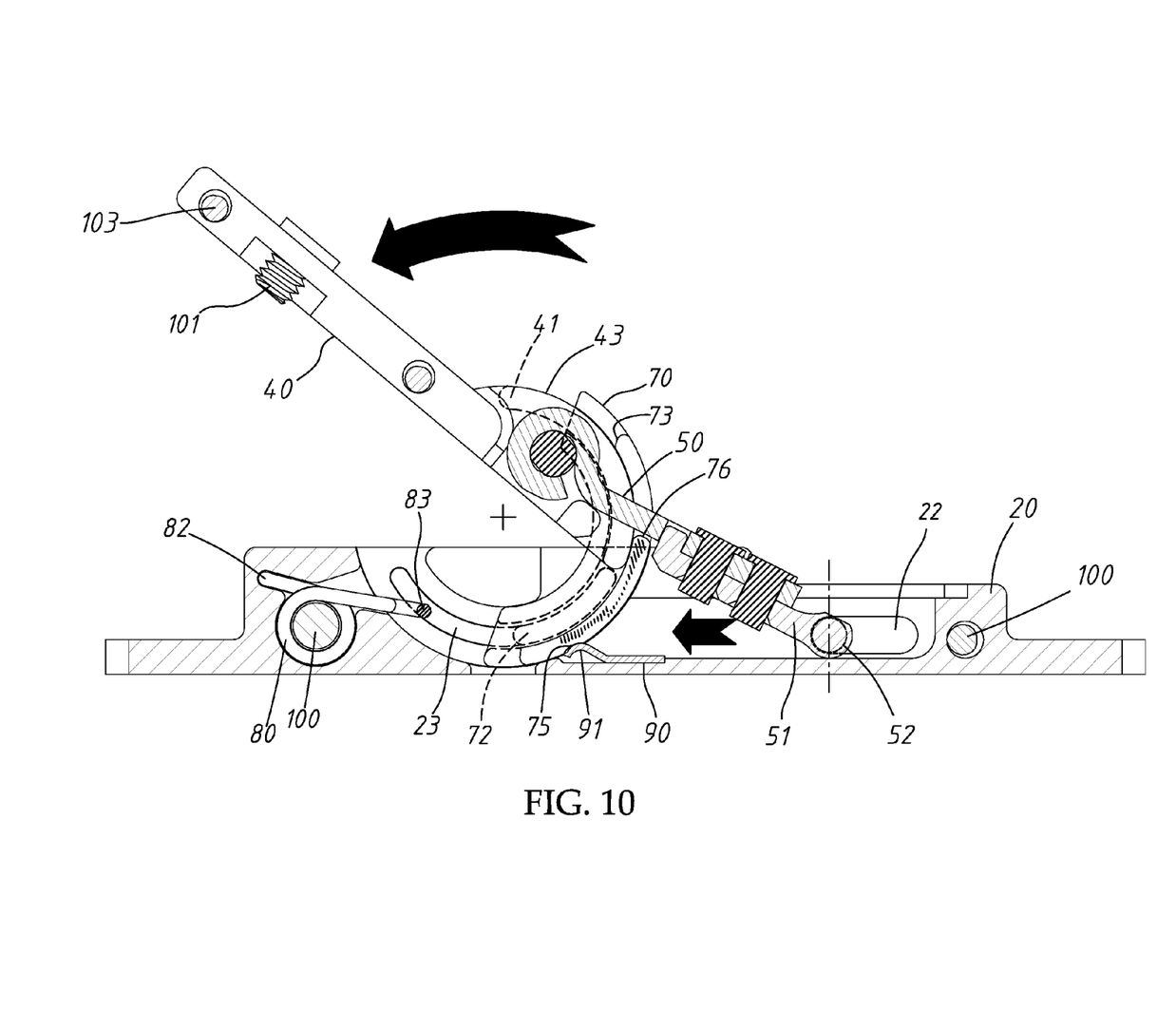
FIG. 10 is cross section of the hinge device of FIG. 7 in a fully opened position.

When the first extending module 340 reaches the right end of the stroke grooves 12 and 22, as shown in FIG. 9, the first extending module 340 rotates with respect to a center O on the curved portions 33 and 43. When the first shaft 52 moves along the stroke grooves 12 and 22, the first extending module 340 rotates with respect to a first center O1. However, when the first shaft 52 moves to the right end, the first extending module 340 move from a position shown by the dashed line to a position shown by the solid line and rotates with respect to a second center O2 so as to push the second extending module 670 at a push point O3 and rotate the second extending module 670. AT this time, the first shaft 52 move to left from the right end of the stroke grooves 12 and 22. As shown in FIGS. 2 and 10, the first extending module 340 can be opened to a maximal angle until the first shaft 52 move to a left end of the stroke grooves 12 and 22 through the mechanisms described above. The second extending module 670 moves through the curved guiding tabs 62 and 72 sliding in the curved grooves 13 and 23 until the convex portion 91 engages the depressed portions 65 and 75. The first extending module 340 can be closed in reversing a process to a closed position as shown in FIGS. 1 and 3.

The hinge device of the invention provides a large open angle of stand. As the first and second extending modules moves outwards sequentially, the hinge device of the invention solves the unstable problem caused by high freedom.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A hinge device, comprising:
   a housing comprising two half-housings, each of the half-housings having two extending plates extending from two ends thereof for mounting to an electronic device, the half-housings are assembled to form an inner space, and each of the half-housings having a stroke groove and a curved groove in a corresponding position;
   a first extending module, adapted to be connected to a stand of the electronic device, comprising two half-members disposed in the inner space, each of the half-members has a curved portion at one end thereof;

a torque-stroke controlling mechanism having one end pivotally connected between the half-members and the other end at which a first shaft is disposed, and the shaft pivotally and slidably extends through the stroke grooves of the two half-housings;

a second extending module comprising two half sliding members slidably disposed on respective outer sides of the first extending module, each of the half sliding member having a push portion disposed on one end thereof and facing a bottom of the first extending module, a stop portion disposed behind the push portion, and a guiding tab having a curved shape and a predetermined length disposed on the other end thereof and slidably engaging the respective curved groove;

a sliding device disposed between the first extending module and the second extending module;

an elastic member having one end disposed between the half-housings and the other end biasing the second extending module; and a stop sheet disposed between the half-housings and having one end facing a bottom of the second extending module for limiting the relative movement between the second extending module and the housing.

2. The hinge device as claimed in claim 1, wherein the torque-stroke controlling mechanism comprises a torque module connected to a connecting member in which the first shaft is disposed.

3. The hinge device as claimed in claim 2, wherein the torque module has a sleeve through which a second shaft extends, and the first extending module comprises two grooves with which two ends of the second shaft engages.

4. The hinge device as claimed in claim 1, wherein the sliding device comprises two first rails disposed on an outer side of the half-members, and each of the half sliding members has a curved groove in which the first rail slides.

5. The hinge device as claimed in claim 1, wherein the elastic member is a coiled spring, and the one end has two sides and the other end is U-shaped, each of the half housings has a chamber accommodating the elastic member, and the chamber has two slots into which the two sides of the one end are inserted, and a bolt extends through the elastic member.

6. The hinge device as claimed in claim 1, wherein the second extending module has a pressing portion configured to be pressed by the other end of the elastic member.

7. The hinge device as claimed in claim 5, wherein the second extending module has a pressing portion configured to be pressed by the other end of the elastic member which is U-shaped.

8. The hinge device as claimed in claim 1, wherein the stop sheet has a convex portion, and the second extending module has a stopping end on which a recess configured to engage the convex portion is formed.

9. The hinge device as claimed in claim 8, wherein the stop sheet is positioned on a depressed portion of the two half-housings, and the convex portion faces the stop portion and the recess.

* * * * *